(12) United States Patent
Chen et al.

(10) Patent No.: US 6,330,355 B1
(45) Date of Patent: Dec. 11, 2001

(54) FRAME LAYOUT TO MONITOR OVERLAY PERFORMANCE OF CHIP COMPOSED OF MULTI-EXPOSURE IMAGES

(75) Inventors: Chia-Hsiang Chen; Chih-Chien Hung; Han-Ming Sheng, all of Hsin-Chu; Hsiang-Chung Liu, Jwu Beei; Chun-Mei Lee, Chu-Dung; De-Ming Liang, Hsin-Chu; Li-Kong Turn, Taichung; Ming-Huei Tseng, Taipei, all of (TW)

(73) Assignee: Taiwan Semiconductor Manufacturing Company, Hsin-chu (TW)

( * ) Notice: Subject to any disclaimer, the term of this patent is extended or adjusted under 35 U.S.C. 154(b) by 0 days.

(21) Appl. No.: 09/283,851

(22) Filed: Apr. 1, 1999

(51) Int. Cl.$^7$ ........................................... G06K 9/32
(52) U.S. Cl. ................ 382/151; 382/144; 250/559.3; 356/620; 356/401
(58) Field of Search ................................ 382/144, 151, 382/287, 289, 291, 294; 348/87, 94, 95, 126; 250/559.3, 559.37; 356/139, 620, 401, 237.4, 237.5; 414/936; 438/16; 700/121, 125; 702/40, 150, 151

(56) References Cited

U.S. PATENT DOCUMENTS

| | | | |
|---|---|---|---|
| 4,353,087 | * 10/1982 | Berry et al. | 358/101 |
| 4,475,811 | 10/1984 | Brunner | 355/133 |
| 4,529,314 | * 7/1985 | Ports | 356/375 |
| 4,538,105 | 8/1985 | Ausschnitt | 324/158 |
| 4,606,643 | * 8/1986 | Tam | 356/401 |
| 5,235,626 | 8/1993 | Flamholz et al. | 378/34 |
| 5,563,012 | 10/1996 | Neisser | 430/22 |
| 5,668,042 | 9/1997 | Bae | 438/18 |
| 5,692,070 | * 11/1997 | Kobayashi | 382/145 |
| 5,695,897 | 12/1997 | Mitome et al. | 430/22 |
| 5,699,282 | 12/1997 | Allen et al. | 364/571.01 |
| 5,701,013 | 12/1997 | Hsia et al. | 250/491.1 |
| 5,757,507 | * 5/1998 | Ausschnitt et al. | 356/401 |
| 5,766,809 | 6/1998 | Bae | 430/22 |
| 6,259,525 | * 7/2001 | David | 356/399 |

* cited by examiner

Primary Examiner—Leo Boudreau
Assistant Examiner—Brian P. Werner
(74) Attorney, Agent, or Firm—George O. Saile; Stephen B. Ackerm; Larry J. Presco

(57) ABSTRACT

A frame layout and method for determining the overlay accuracy of a first chip image relative to a second chip image when the first and second chip images are used to form a single chip. One embodiment employs a vernier scale in two orthoginal directions included in the scribeline of both the first chip image and the second chip image. Another embodiment employs a box in box pattern included in the scribeline of both the first chip image and the second chip image. A layer of photoresist on an integrated circuit wafer is exposed with the first and second chip image and the associated monitor images. When the photoresist is developed the overlay accuracy of the first chip image relative to the second chip image can be determined directly from the monitor images in the photoresist.

22 Claims, 9 Drawing Sheets

FRAME LAYOUT TO MONITOR OVERLAY PERFORMANCE OF CHIP COMPOSED OF MULTI-EXPOSURE IMAGES

BACKGROUND OF THE INVENTION

1. Field of the Invention

This invention relates to monitoring the overlay performance for chips composed of multi-exposure images and more particularly to the use of a new vernier test pattern to monitor overlay performance.

2. Description of the Related Art

As chip sizes become larger the limits of the projection system used to fabricate the chips becomes a limitation on allowable chip size. One method of overcoming this limitation is to form the chip in two separate images projected adjacent to each other on the wafer. The accuracy of the overlay or alignment of these two images is a key factor in the success of this method.

U.S. Pat. No. 4,538,105 to Ausschnitt describes an overlay test wafer for determining the overlay alignment of a second level pattern over a first level pattern.

U.S. Pat. No. 5,563,012 to Neisser describes a multi mask method of forming an image to enhance selective mask features.

U.S. Pat. No. 4,475,811 to Brunner describes an overlay test measurement system for testing lithographic instruments.

U.S. Pat. No. 5,699,282 to Allen et al. describes a method and test structures for measuring overlay accuracy in multilayer devices. The reference structure is qualified and overlay accuracy is measured using electrical measurements.

U.S. Pat. No. 5,235,626 to Flamholz et al. describes a segmented mask for an x-ray lithography system.

U.S. Pat. No. 5,695,897 to Mitome et al. describes an alignment method for a first stepper used in conjunction with a second stepper.

U.S. Pat. No. 5,668,042 to Bae describes a method for aligning micro patterns of a semiconductor device.

U.S. Pat. No. 5,766,809 to Bae describes a method for testing an overlay occurring in a semiconductor device to compensate for an error generated in the measurement of the overlay. The method uses a box-in-box pattern and an inclined measuring mark.

U.S. Pat. No. 5,701,013 to Hsia et al. describes a pattern using a box-in-box pattern for measuring overlay and critical dimensions.

SUMMARY OF THE INVENTION

Due to the limitations of the projection systems use d to fabricate large integrated circuit chips it is frequently necessary to form large chips from two separate chip images projected on the wafer. The chip images are designed so that each chip image has an overlap area where one chip image interconnects to the other chip image. It is important to have an in-process process monitor to measure the accuracy of the alignment of the two adjoining chip images. Most alignment methods are related to alignment marks on a wafer, or the like, which determine the alignment of each chip image separately.

It is a principal objective of this invention to provide a mask having a frame cell design which permits the overlay accuracy of two adjacent chip images to be monitored.

It is another principal objective of this invention to provide a mask having a frame cell design which permits the overlay accuracy of two adjacent chip images to be monitored.

It is another principal objective of this invention to provide a method of monitoring the overlay accuracy of two adjacent chip images using a mask having a frame cell designed for the monitoring purpose.

These objectives are achieved by means of alignment patterns located in the scribe line region of two chip images which can be used to align the two chip images. In one of the embodiments the alignment patterns use vernier test patterns located in the scribe line region of the two chip images which can be used to monitor the alignment accuracy directly. In one of the embodiments a box in box pattern is used. Two patterns are located in the scribe line for each of the chip images. The patterns are oriented to measure alignment in the X, or horizontal, direction and the Y, or vertical, direction. As the layer of photoresist formed on the wafer is exposed with the chip images the monitor patterns for the first and second chip images are also exposed in the layer of photoresist. The two sets of monitor patterns are arranged to measure the overlay accuracy of the two chip images. When the layer of photoresist is developed the monitor patterns transferred to the layer of photoresist can be examined to provide information about the overlay alignment in both the X and Y directions for the two chip images.

DESCRIPTION OF THE PREFERRED EMBODIMENTS

Figure 1:
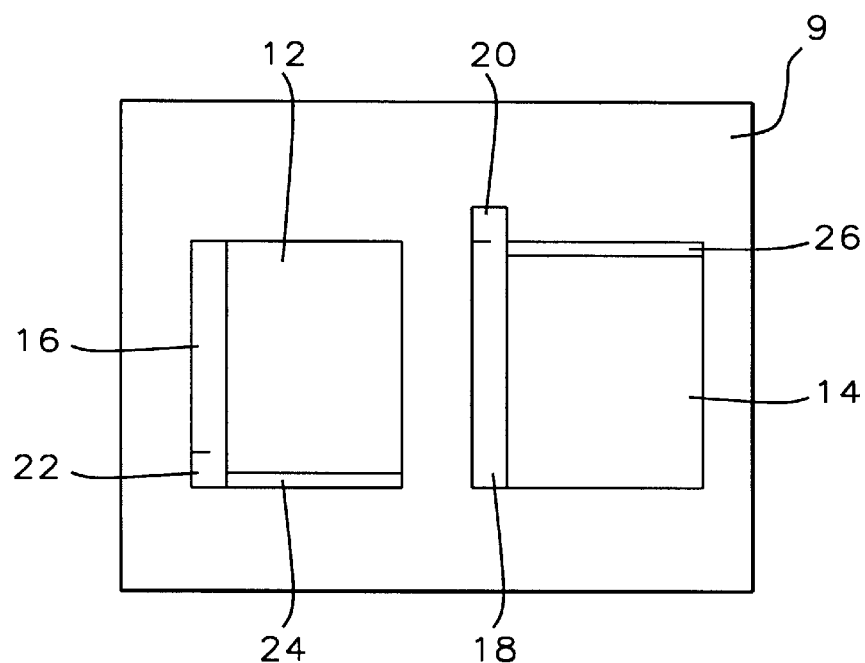
FIG. 1 shows a top view of a frame layout showing two chip images, two scribeline regions, and two alignment regions where vernier patterns are located.

Refer now to FIGS. 1–8 for a description of the vernier monitor pattern and method of this invention. FIG. 1 shows a top view of a mask used in the fabrication of a chip which is too large for a single chip image. The mask 9 has a first chip image 12 and a second chip image 14. The first chip image 12 has a first overlap region 24 and the second chip image 14 has a second overlap region 26. When the first chip image 12 and second chip image 14 are transferred to the wafer the first overlap region 24 and second overlap region 26 should overlap and provide the interconnection between the first chip image 12 and the second chip image 14.

There is a first scribeline region 16 associated with the first chip image 12 and a second scribeline region 18 associated with the second chip image 14. The first scribeline region 16 contains a first alignment region 22 and the second scribeline region 18 contains a second alignment region 20. As can be seen in FIG. 1, the first alignment region 20 is at the lower right hand corner of the first chip image 12 and the second alignment region 20 protrudes just above the upper right hand corner of the second chip image 14. When the chip images are formed on the wafer the first alignment region 22 and the second alignment region 20 overlap and provide the means for determining the accuracy of the alignment of the first chip image 12 relative to the second chip image 14, or the overlay, as will be explained shortly.

Figure 2:
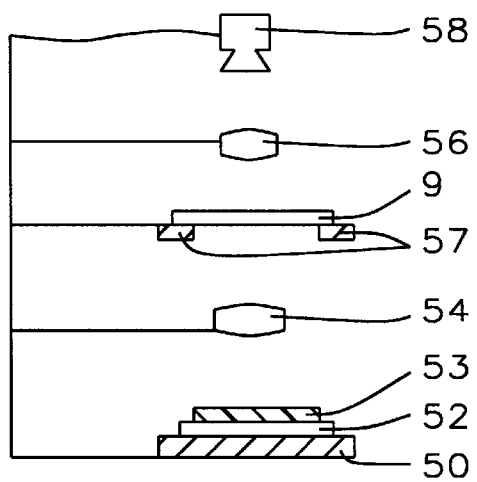
FIG. 2 shows a schematic view of a projection exposure system used to transfer a mask pattern to a layer of photoresist on a wafer.
Figure 3:
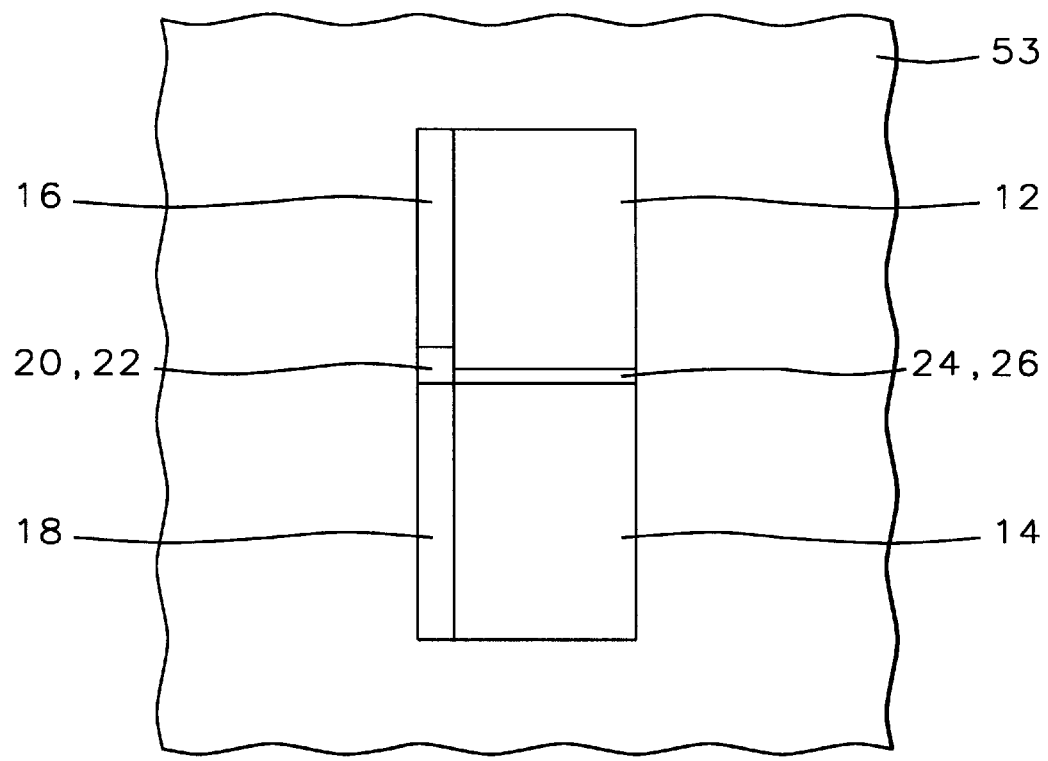
FIG. 3 shows a top view of a part of a wafer showing the two chip images and the overlapping alignment regions.

FIG. 2 shows a schematic view of a projection exposure system used to transfer the chip images to an integrated circuit wafer. The projection exposure system comprises a light source 58, a condensing lens 56, a mask holder 57, an objective lens 54, and a wafer holder 52. An integrated circuit wafer 52, having a layer of photoresist 53 formed thereon, is placed in the wafer holder 50. The mask 9, described above, is placed in the mask holder 57. The positions of the mask holder 57 and wafer holder 50 are aligned using the appropriate wafer alignment marks and the first chip image 12, the first overlap region 24, the first scribeline region 16, and the first alignment region 22 are projected onto the wafer 52 exposing the photoresist 53, see FIG. 3. Next the positions of the mask holder 57 and wafer holder 50 are again aligned using the appropriate wafer alignment marks and the second chip image 14, the second overlap region 26, the second scribeline region 18, and the second alignment region 20 are projected onto the wafer 52 exposing the photoresist 53, see FIG. 3. The layer of photoresist is then developed.

Figure 4:
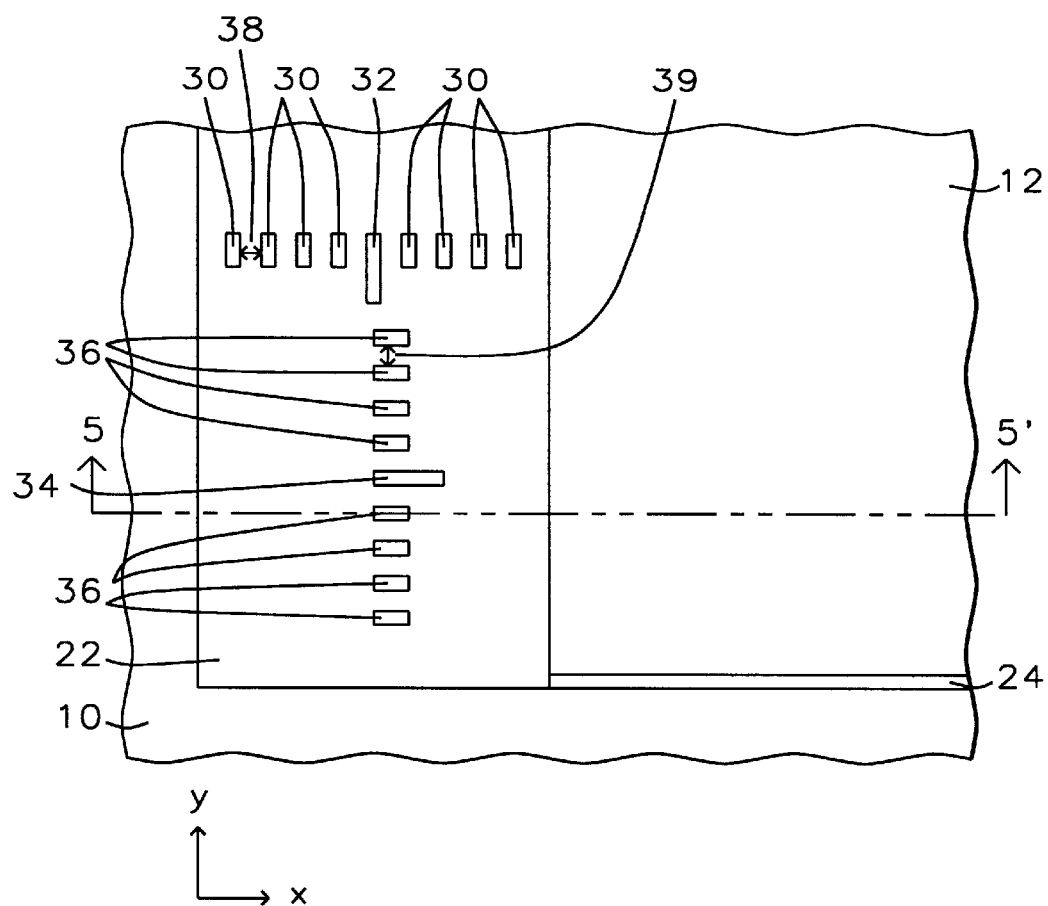
FIG. 4 shows a top view of the part of the mask containing the alignment region of the first chip image showing the vernier patterns in both the X and Y directions.

The detail of the first alignment region is shown in FIG. 4. The first alignment region 22 contains a number, in this example nine, of parallel and equally spaced first horizontal alignment lines, 30 and 32, and a number, in this example nine, of parallel and equally spaced first vertical alignment lines, 34 and 36. One of the first horizontal alignment lines 32 is longer than the other first horizontal alignment lines 30, and in this example the center horizontal alignment line 32 is longer. One of the first vertical alignment lines 34 is longer than the other first vertical alignment lines 36, and in this example the center vertical alignment line 34 is longer. The horizontal alignment lines, 30 and 32, are perpendicular to the vertical alignment lines 34 and 36. The space 38 between the first horizontal alignment lines in this example is such that the projected image of the space 38 is about 5.0 micrometers. The space 39 between the first vertical alignment lines in this example is also such that the projected image of the space 39 is about 5.0 micrometers.

Figure 5:
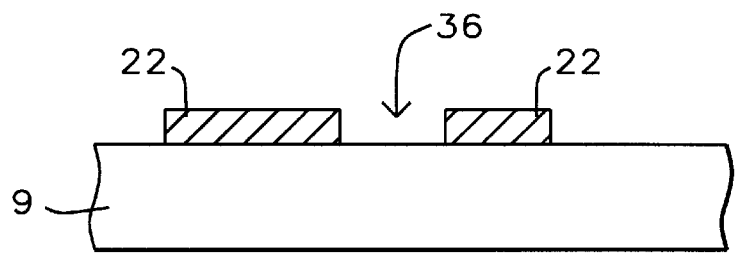
FIG. 5 shows a cross section view the mask of FIG. 4 taken along line 5–5' of FIG. 4 showing the formation of one of the vernier marks.

As can be seen in FIG. 5, the alignment lines are formed in a layer of opaque material 22, such as chrome or the like, which has been formed on a transparent mask substrate 9, such as quartz. FIG. 5 is a cross section view of the mask of FIG. 4 taken along line 5–5' of FIG. 4. This results in transparent alignment lines surrounded by opaque material, which avoids overexposure of the photoresist by the alignment regions.

Figure 6:
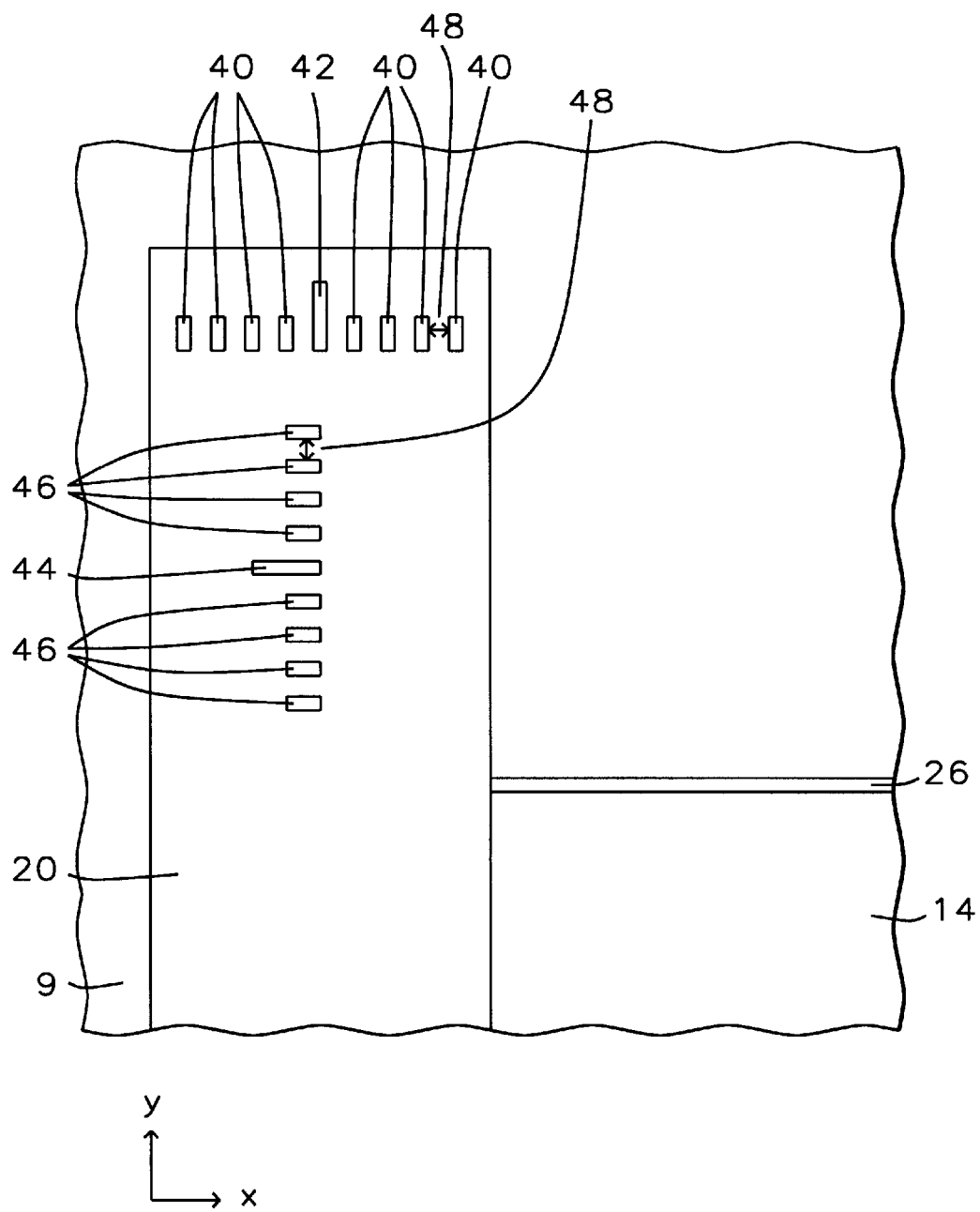
FIG. 6 shows a top view of the alignment region of the second chip image showing the vernier patterns in both the X and Y directions.

The detail of the second alignment region is shown in FIG. 6. The second alignment region 20 contains a number, in this example nine, of parallel and equally spaced second horizontal alignment lines, 40 and 42, and a number, in this example nine, of parallel and equally spaced second vertical alignment lines, 44 and 46. One of the second horizontal alignment lines 42 is longer than the other second horizontal alignment lines 40, and in this example the center horizontal alignment line 42 is longer. One of the second vertical alignment lines 44 is longer than the other second vertical alignment lines 46, and in this example the center vertical alignment line 44 is longer. The horizontal alignment lines, 40 and 42, are perpendicular to the vertical alignment lines 44 and 46. The space 48 between the second horizontal alignment lines must be less than the space 38 between the first horizontal alignment lines by a particular difference. In this example the space 48 between the second horizontal alignment lines is about 4.9 micrometers and the difference between the space between the first horizontal alignment lines and the second horizontal alignment lines is about 0.1 micrometer. The space 49 between the second vertical alignment lines must be less than the space 39 between the first vertical alignment lines by a particular distance. In this example the space 49 between the second vertical alignment lines is such that the projected image of the space 49 is about 4.9 micrometers and the difference between the projected image of the space between the first vertical alignment lines and the second vertical alignment lines is about 0.1 micrometer.

The first and second horizontal alignment lines will be used to determine the overlay alignment accuracy in the X, or horizontal, direction. The first and second vertical alignment lines will be used to determine the overlay alignment accuracy in the Y, or vertical, direction.

Figure 7:
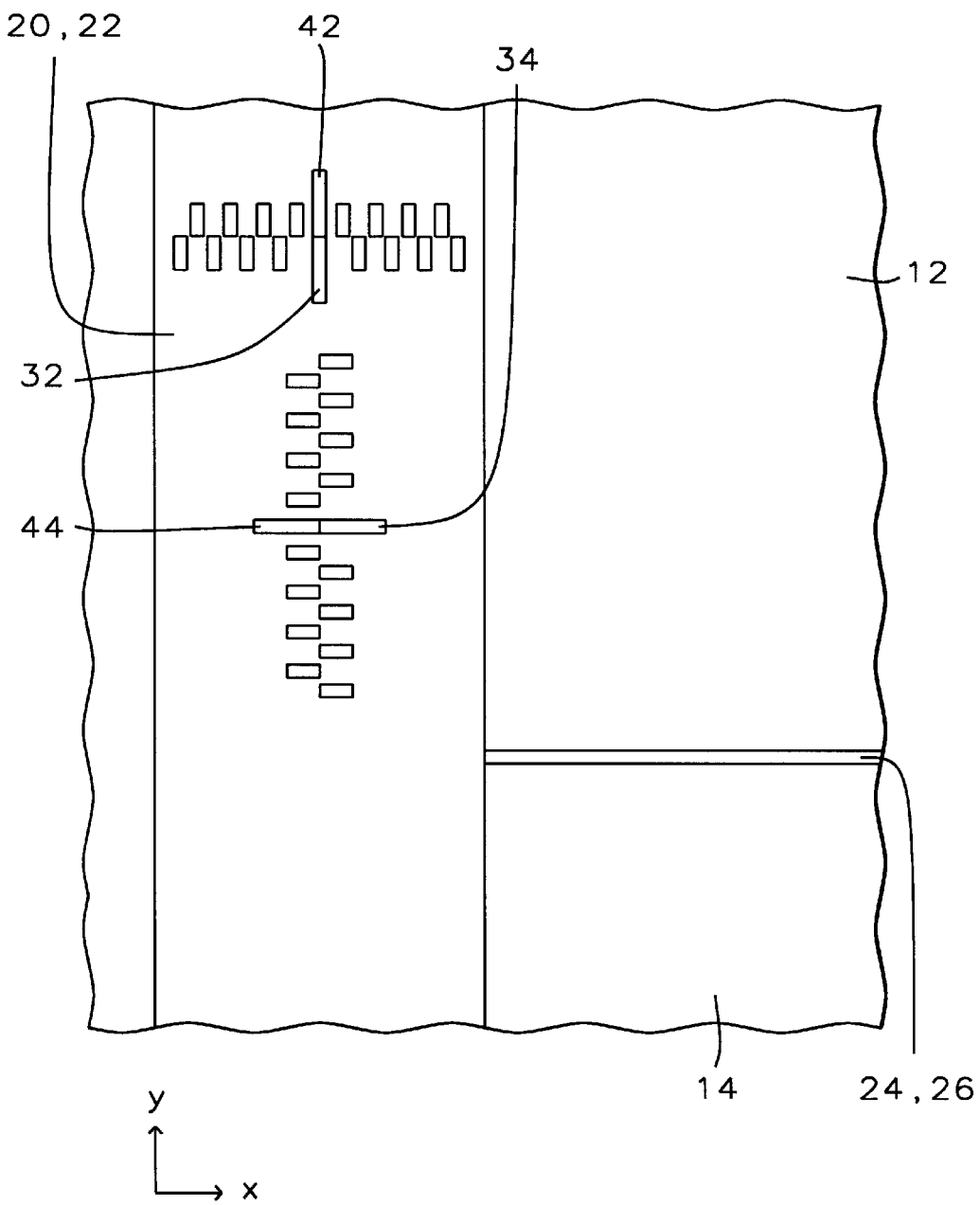
FIG. 7 shows the image formed in the layer of photoresist after projecting the first and second chip images showing perfect alignment in both the X and Y directions.
Figure 8:
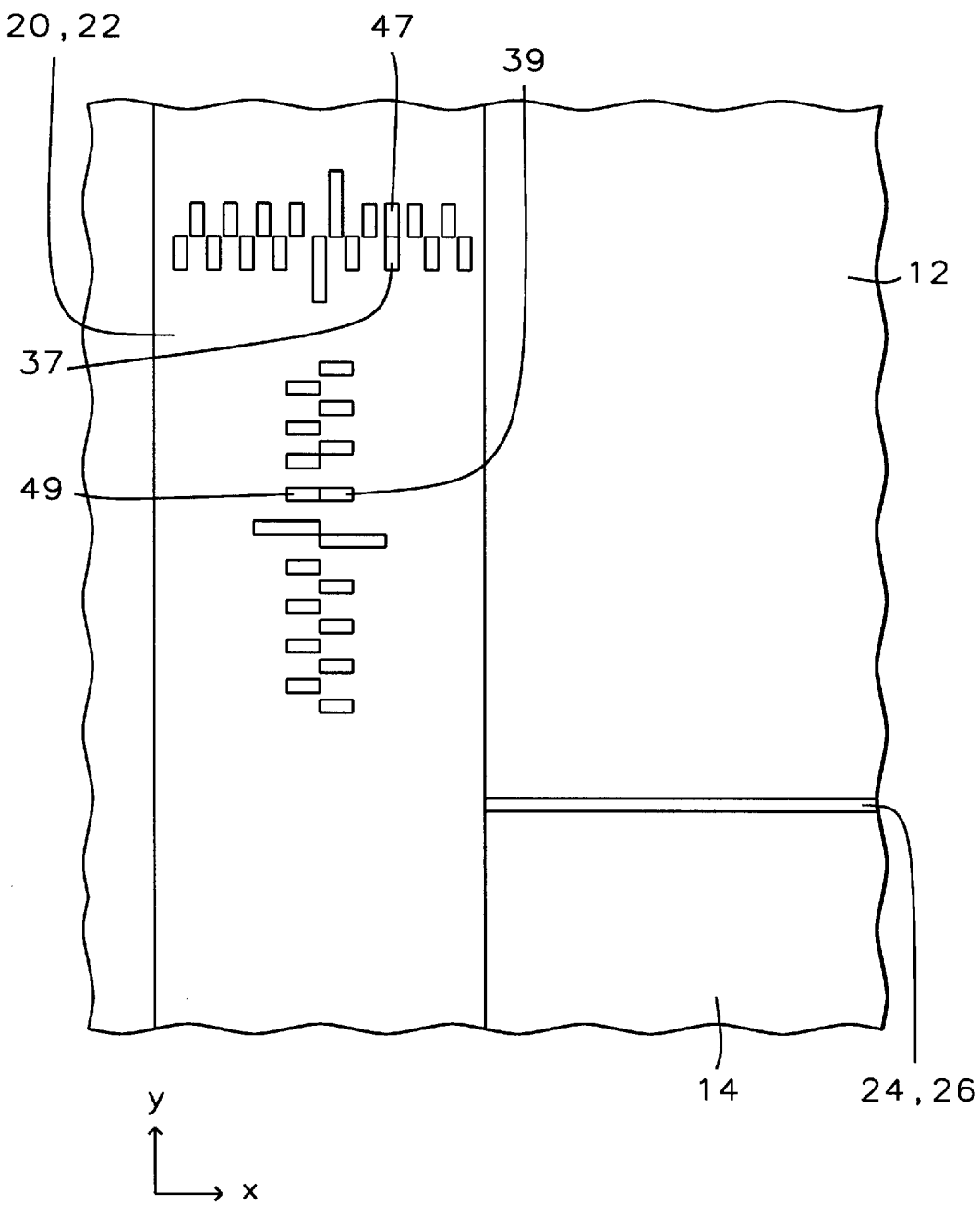
FIG. 8 shows the image formed in the layer of photoresist after projecting the first and second chip images showing an overlay alignment error of 0.2 micrometers in the X directions and 0.1 micrometers in the Y direction.

FIGS. 7 and 8 show the pattern formed in the scribeline region of the wafer after the layer of photoresist has ben developed. As shown in FIGS. 7 and 8, the alignment marks are located such that the image of the first horizontal alignment marks in the photoresist are adjacent to the image of the second horizontal alignment marks in the photoresist and the image of the first vertical alignment marks in the photoresist are adjacent to the image of the image of the second vertical alignment marks.

FIG. 7 shows the position of the alignment marks when the two chip images, 12 and 14, are perfectly aligned with each other. As shown in FIG. 7, the alignment marks are located such that perfect alignment is indicated by the image of longest first horizontal alignment mark 32 in the developed photoresist lining up with the image of the longest second horizontal alignment mark 42 in the developed photoresist and the image of the longest first vertical alignment mark 34 in the developed photoresist lining up with the image of the longest second vertical alignment mark 44 in the developed photoresist. Since the image of the spacing between the first horizontal alignment marks is greater than the image of the spacing between the second horizontal alignment marks by a pre-determined distance, in this example about 0.1 micrometers, and the spacing between the image of the first vertical alignment marks is greater than the image of the spacing between the second vertical alignment marks by a pre-determined distance, in this example about 0.1 micrometers, the horizontal alignment marks serve as a vernier scale in the X direction and the vertical alignment marks serve as a vernier in the Y direction to determine the overlay alignment accuracy of the images in the developed layer of photoresist in both the X and Y directions.

As described above, FIG. 7 shows the image of the alignment marks in the layer of developed photoresist when the first chip image 12 and second chip image 14 are perfectly aligned with each other in both the X and Y directions. FIG. 8 shows the case where the first chip image 12 and the second chip image 14 are misaligned in the X direction by two times the difference of the spacing between the first horizontal alignment marks and the spacing between the second horizontal alignment marks, in this example about 0.2 micrometers, since the second first horizontal alignment mark to the right of the longest first horizontal alignment mark 37 lines up with the second second horizontal alignment mark to the right of the longest second horizontal alignment mark 47. FIG. 8 also shows the case where the first chip image 12 and the second chip image 14 are misaligned in the Y direction by one times the difference of the spacing between the first vertical alignment marks and the spacing between the second vertical alignment marks, in this example about 0.1 micrometers, since the first first vertical alignment mark above the longest first vertical alignment mark 39 lines up with the first second vertical alignment mark above the longest second vertical alignment mark 49.

The image of the alignment marks in the photoresist gives a very direct means to observe the overlay alignment accuracy of the first chip image 12 relative to the second chip image 14. This alignment accuracy can be quickly observed and processing of the wafer continued if the accuracy is within the established tolerance limits. If the accuracy is outside the tolerance limits the photoresist can be stripped and the wafer can be re-worked. This method of determining overlay accuracy does not require a stationary etched layer as a reference, since the reference is included in the mask used to form the chip images.

Figure 9:
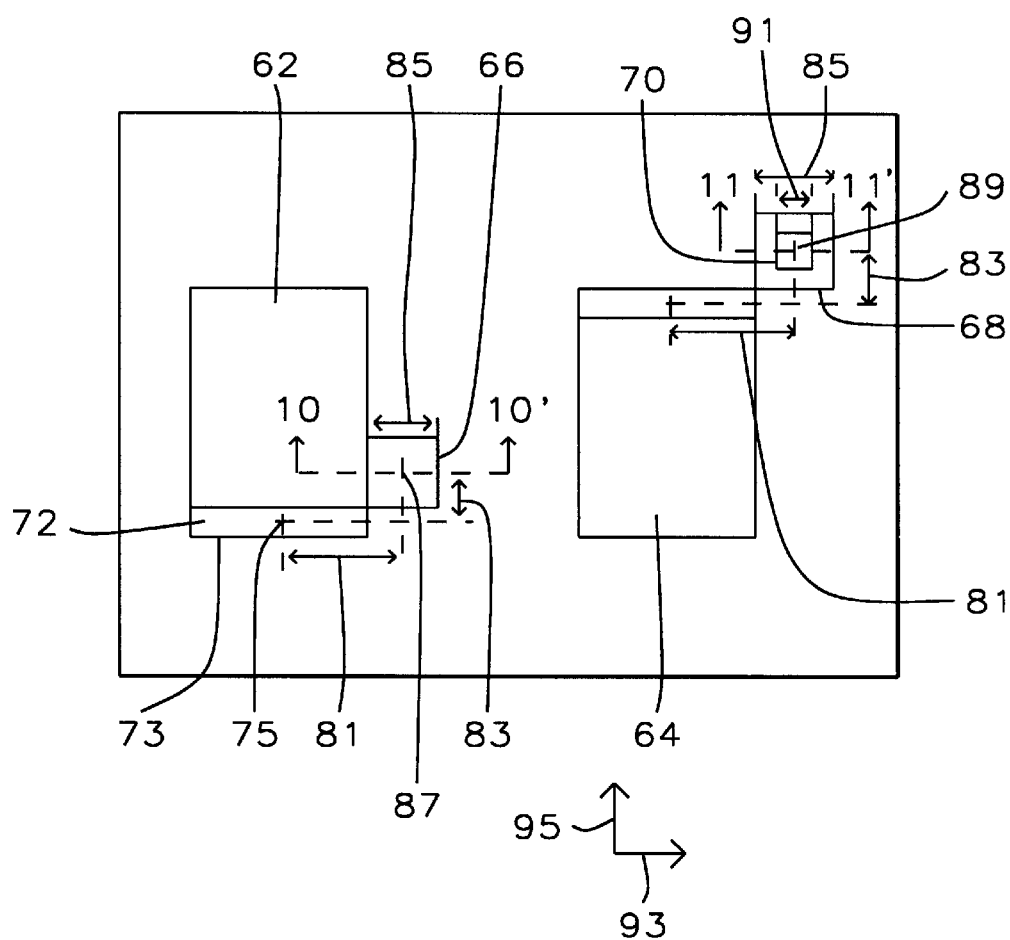
FIG. 9 shows a top view of a frame layout showing two chip images and two box in box patterns.

Refer now to FIGS. 2 and 9–14 for a description of the box in box monitor pattern and method of this invention. FIG. 9 shows a top view of a mask used in the fabrication of a chip which is too large for a single chip image. The mask 9 has a first chip image 62 and a second chip image 64. The first chip image 62 has a first overlap region 72 and the second chip image 64 has a second overlap region 74. The first overlap region 72 has a center point 75, located exactly in the center of the first overlap region 72, and a first edge 73. The second overlap region 74 has a center point 79, located exactly in the center of the second overlap region 74, and a first edge 77. When the first chip image 62 and the second chip image 64 are transferred to the wafer the first overlap region 72 and the second overlap region 74 should overlap, so that the center point 75 of the first overlap region 72 and the center point 79 of the second overlap region 74 coincide and the first edge 73 of the first overlap region 72 is parallel to the first edge 77 of the second overlap region 74, and provide the interconnection between the first chip image 62 and the second chip image 64.

There is a first monitor image, comprising a first square 66, located in the scribeline region adjacent to the first chip image 62. The first square 66 has the shape of a square box with the sides of the square parallel to and perpendicular to the first edge 73 of the first overlap region 72. The first square 66 has sides having a first length 85 and a center point 87. The center point 87 of the first square 66 is located a first distance 81 in a first direction 93 from the center point 75 of the first overlap region 72 and a second distance 83 in a second direction 95 from the center point 75 of the first overlap region 72. The first direction 93 is parallel to the first edge 73 of the first overlap region 72 and the second direction 95 is perpendicular to the first edge 73 of the first overlap region 72. The first edge 73 of the first overlap region 72 is parallel to the first edge 77 of the second overlap region 74.

There is a second monitor image, comprising a second square 70 located inside a third square 68, located in the scribeline region adjacent to the second chip image 64. The third square 68 has the shape of a square box with the sides of the square parallel to and perpendicular to the first edge 77 of the second overlap region 74. The third square 68 is the same size as the first square 66, having sides of the first length 85, and has a center point 89. The second square 70 has the shape of a square box with the sides of the square parallel to and perpendicular to the first edge 77 of the second overlap region 74. The second square 70 has sides having a second length 91 and a center point 89 which is coincident with the center point 89 of the third square 68. The center point 89 of the second square 70 is located the first distance 81 in the first direction 93 from the center point 79 of the second overlap region 74 and the second distance 83 in the second direction 95 from the center point 79 of the second overlap region 74. The first distance 81 and second distance 83 locating the center point 89 of the second square 70 as the same as the first distance 81 and second distance 83 locating the center point 75 of the first square 66.

Figure 10:
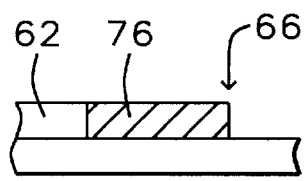
FIG. 10 shows a cross section view of the mask of FIG. 9 taken along line 10–10' of FIG. 9.

As can be seen in FIG. 10, the first square 66 is formed from opaque material 76, such as chrome or the like, which has been formed on a transparent mask substrate, such as quartz. FIG. 10 is a cross section view of the mask of FIG. 9 taken along line 10–10' of FIG. 9 and also shows part of the first chip image 62. The detail of the first chip image 62 are not shown in FIG. 10.

Figure 11:
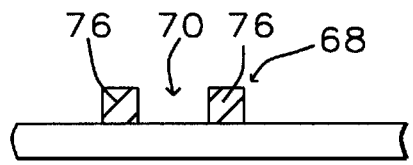
FIG. 11 shows a cross section view of the mask of FIG. 9 taken along line 11–11' of FIG. 9.

As can be seen in FIG. 11 the second square 70 is formed by removing opaque material and leaving the transparent mask substrate. The third square 68 is formed by opaque material 76 remaining on the transparent mask substrate. FIG. 11 is a cross section view of the mask of FIG. 9 taken along line 11–11' of FIG. 9.

FIG. 2 shows a schematic view of a projection exposure system used to transfer the chip images to an integrated circuit wafer. The projection exposure system comprises a light source 58, a condensing lens 56, a mask holder 57, an objective lens 54, and a wafer holder 52. An integrated circuit wafer 52, having a layer of photoresist 53 formed thereon, is placed in the wafer holder 50. The mask 9, described above, is placed in the mask holder 57. The positions of the mask holder 57 and wafer holder 50 are aligned using the appropriate wafer alignment marks and the first chip image 62, the first overlap region 72, and the first monitor image, consisting of the first square 66, are projected onto the wafer 52 exposing the photoresist 53. Next the positions of the mask holder 57 and wafer holder 50 are again aligned using the appropriate wafer alignment marks and the second chip image 64, the second overlap region 74, and the second monitor image, comprising the second square 68 and the third square 70, are projected onto the wafer 52 exposing the photoresist 53. The layer of photoresist is then developed.

Figure 12:
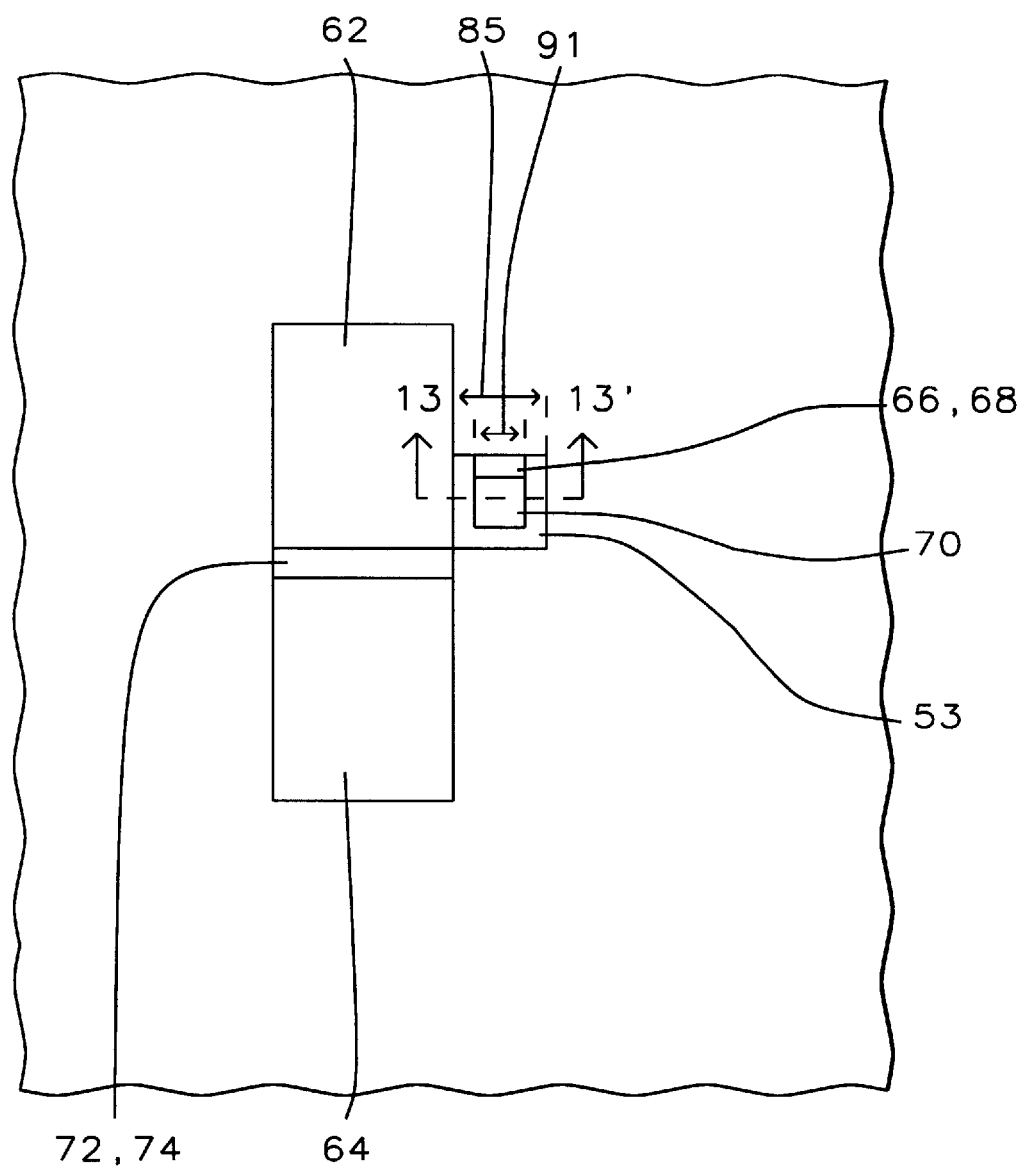
FIG. 12 shows a top view of a part of a wafer showing the two chip images and the overlapping box in box patterns.

FIG. 12 shows the location of the developed images as they are formed in the layer of photoresist 53. FIG. 12 shows the location of the developed images of the first chip image 62, the second chip image 64, the first overlap region 72, the second overlap region, 74, the first square 66, the second square 70, and the third square 68 in the photoresist layer formed on the wafer. FIG. 12 also shows the developed images of the first length 85 and the second length 91. In this example the developed image of the first length 85 has a length of between about 12 and 20 micrometers, preferably 16 micrometers. In this example the developed image of the second length 91 has a length of between about 4 and 12 micrometers, preferably 8 micrometers.

Figure 13:
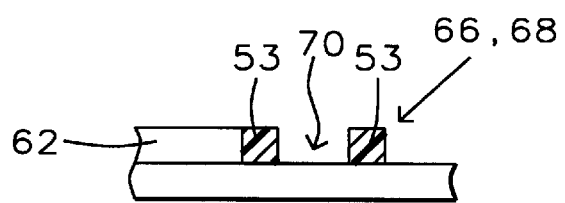
FIG. 13 shows a cross section of part of the wafer of FIG. 12 taken along line 13–13' of FIG. 12.

FIG. 13 shows a cross section view of the developed images of the first square 66, the second square 70, and the third square 68 in the layer of photoresist 53 formed on the wafer. The cross section view shown in FIG. 13 is taken along line 13–13' of FIG. 12.

Figure 14:
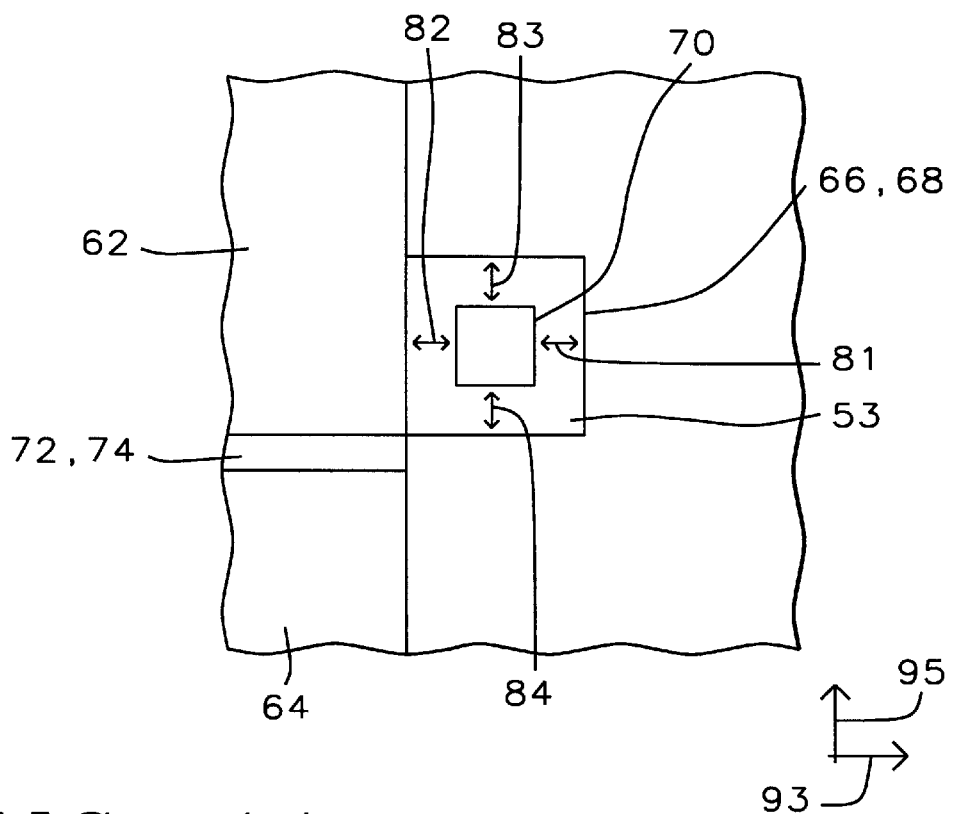
FIG. 14 shows the image formed in the layer of photoresist after projecting the first and second chip showing the box in box pattern used to assess overlay alignment error in both the X and Y directions.

FIG. 14 shows the images of the first chip image 62, the second chip image 64, the first overlap region 72, the second overlap region 74, the first square 66, the second square 70, and the third square 68 in the developed layer of photoresist. FIG. 14 shows images of four distances, a third distance 81, a fourth distance 82, a fifth distance 83, and a sixth distance 84. The third distance 81, fourth distance 82, fifth distance 83, and sixth distance 84 are the distances between the sides of the image of the second square 70 in the developed photoresist 53 and the sides of image of either the first square 66 or the third square 68 in the developed photoresist 53. If the two chip images, 62 and 64 are perfectly aligned with each other the third distance 81 will be equal to the fourth distance 82, and the fifth distance 83 will be equal to the sixth distance 84. If the two chip images, 62 and 64, are misaligned in the first direction 93 the third distance 81 will not be equal to the fourth distance 82. If the two chip images, 62 and 64, are misaligned in the second direction 95, the fifth distance 83 will not be equal to the sixth distance 84. If the two chip images, 62 and 64, are misaligned in both the first 93 and second 95 directions the third distance 81 will not be equal to the fourth distance 82, and the fifth distance 83 will not be equal to the sixth distance 84.

The image of the alignment marks in the photoresist gives a very direct means to observe the overlay alignment accuracy of the first chip image 62 relative to the second chip image 64. This alignment accuracy can be quickly observed and processing of the wafer continued if the accuracy is within the established tolerance limits. If the accuracy is outside the tolerance limits the photoresist can be stripped and the wafer can be re-worked. This method of determining overlay accuracy does not require a stationary etched layer as a reference, since the reference is included in the mask used to form the chip images.

While the invention has been particularly shown and described with reference to the preferred embodiments thereof, it will be understood by those skilled in the art that various changes in form and details may be made without departing from the spirit and scope of the invention.

What is claimed is:

1. An alignment monitor for overlay images, comprising:
  a transparent mask substrate;
  a first chip image, a first scribeline region containing a first alignment region, a second chip image, and a second scribeline region containing a second alignment region formed in a layer of opaque material on said transparent mask substrate;
  a first number of parallel and equally spaced transparent first horizontal alignment lines formed in said layer of opaque material in said first alignment region, wherein the space between adjacent said first horizontal alignment lines is a first distance and one of said first horizontal alignment lines is longer than the other said first horizontal alignment lines;
  a second number of parallel and equally spaced transparent first vertical alignment lines formed in said layer of opaque material in said first alignment region, wherein the space between adjacent said first vertical alignment lines is said first distance, one of said first vertical alignment lines is longer than the other said first vertical alignment lines, and said first vertical alignment lines are perpendicular to said first horizontal alignment lines;
  said first number of parallel and equally spaced transparent second horizontal alignment lines formed in said layer of opaque material in said second alignment region, wherein the space between adjacent said second horizontal alignment lines is a second distance, said second distance is a third distance less than said first distance, and one of said second horizontal alignment lines is longer than the other said second horizontal alignment lines; and
  said second number of parallel and equally spaced transparent second vertical alignment lines formed in said layer of opaque material in said second alignment region, wherein the space between adjacent said second vertical alignment lines is said second distance, one of said second vertical alignment lines is longer than the other said second vertical alignment lines, and said second vertical alignment lines are perpendicular to said second horizontal alignment lines.

2. The alignment monitor of claim 1 wherein said first horizontal alignment marks, said first vertical alignment marks, said second horizontal alignment marks, and said second vertical alignment marks are located such that perfect alignment of an overlay image is indicated by the image of said longer first horizontal alignment mark directly overlaying the image of said longer second horizontal alignment mark and the image of said longer first vertical alignment mark directly overlaying the image of said longer second vertical alignment mark.

3. The alignment monitor of claim 1 wherein said third distance is such that when the alignment monitor is used with an image projection system the projected image of said third distance is about 0.1 micrometer.

4. The alignment monitor of claim 1 wherein said first horizontal alignment lines, said first vertical alignment lines, said second horizontal alignment lines, and said second vertical alignment lines are formed by removing portions of said layer of opaque material.

5. The alignment monitor of claim 1 wherein said first distance is such that when the alignment monitor is used with an image projection system the projected image of said first distance is about 5.0 micrometers.

6. The alignment monitor of claim 1 wherein said second distance is such that when the alignment monitor is used with an image projection system the projected image of said second distance about 4.9 micrometers.

7. The alignment monitor of claim 1 wherein said first number and said second number are nine.

8. A method of monitoring overlay performance, comprising:
  providing a transparent mask substrate;
  forming a first chip image, a first scribeline region containing a first alignment region, a second chip image, and a second scribeline region containing a second alignment region on said transparent mask substrate;

forming a layer of opaque material on said transparent mask substrate in said first alignment region;

forming a layer of said opaque material on said transparent mask substrate in said second alignment region;

forming a first number of parallel and equally spaced transparent first horizontal alignment lines in said layer of opaque material in said first alignment region, wherein the space between adjacent said first horizontal alignment lines is a first distance and one of said first horizontal alignment lines is longer than the other said first horizontal alignment lines;

forming a second number of parallel and equally spaced transparent first vertical alignment lines in said layer of opaque material in said first alignment region, wherein the space between adjacent said first vertical alignment lines is said first distance, one of said first vertical alignment lines is longer than the other said first vertical alignment lines, and said first vertical alignment lines are perpendicular to said first horizontal alignment lines;

forming said first number of parallel and equally spaced transparent second horizontal alignment lines in said layer of opaque material in said second alignment region, wherein the space between adjacent said second horizontal alignment lines is a second distance, said second distance is a third distance less than said first distance, and one of said second horizontal alignment lines is longer than the other said second horizontal alignment lines;

forming said second number of parallel and equally spaced transparent second vertical alignment lines in said layer of opaque material in said second alignment region, wherein the space between adjacent said second vertical alignment lines is said second distance, one of said second vertical alignment lines is longer than the other said second vertical alignment lines, and said second vertical alignment lines are perpendicular to said second horizontal alignment lines;

providing a wafer having a layer of photoresist formed thereon;

providing an image projection system;

forming an overlay image by projecting images of said first image region, said second image region, said first alignment region, and said second alignment region on said layer of photoresist using said image projection system, wherein the image of said second alignment region directly overlays the image of said first alignment region;

forming said overlay image in said layer of photoresist by developing said layer of photoresist; and monitoring the overlay accuracy by observing said first alignment region and said second alignment region in said developed layer of photoresist.

9. The method of claim 8 wherein said first horizontal alignment marks, said first vertical alignment marks, said second horizontal alignment marks, and said second vertical alignment marks are located such that perfect alignment of said overlay image is indicated by the image of said longer first horizontal alignment mark in said developed layer of photoresist directly overlaying the image of said longer second horizontal alignment mark in said developed layer of photoresist and the image of said longer first vertical alignment mark in said developed layer of photoresist directly overlaying the image of said longer second vertical alignment mark in said developed layer of photoresist.

10. The method of claim 8 wherein the image of said third distance in said developed layer of photoresist is about 0.1 micrometer.

11. The method of claim 8 wherein said first horizontal alignment lines, said first vertical alignment lines, said second horizontal alignment lines, and said second vertical alignment lines are formed by removing portions of said layer of opaque material.

12. The method of claim 8 wherein the image of said first distance in said developed layer of photoresist is about 5.0 micrometers.

13. The method of claim 8 wherein the image of said second distance in said developed layer of photoresist is about 4.9 micrometers.

14. The method of claim 8 wherein said first number and said second number are nine.

15. An alignment monitor for overlay images, comprising:

a transparent mask substrate;

patterned opaque material formed on said transparent mask substrate;

a first chip image formed in said patterned opaque material;

a first overlap region formed in said first chip image, wherein said first overlap region has a center point and a first edge, a second chip image formed in said patterned opaque material;

a second overlap region formed in said second chip image, wherein said second overlap region has a center point and a first edge;

a first square of said opaque material, wherein said first square has a center point, the length of the sides of said first square is equal to a first length, the sides of said first square are either parallel to or perpendicular to said first edge of said first overlap region, and said first square is located so that said center point of said first square is a first distance in a first direction from said center point of said first overlap region and a second distance in a second direction from said center point of said first overlap region, said first direction is parallel to said first edge of said first overlap region, and said second direction is perpendicular to said first edge of said first overlap region;

a second square formed by removal of said opaque material, wherein said second square has a center point, the length of the sides of said second square is equal to a second length, and said sides of said second square are parallel to or perpendicular to said first edge of said second overlap region; and a third square of said opaque material located within said second square, wherein said third square has a center point, the length of the sides of said third square is equal to said first length, the sides of said third square are either parallel to or perpendicular to said first edge of said second overlap region, said center point of said third square has the same location as said center point of said second square, and said third square is located so that said center point of said third square is said first distance in said first direction from said center point of said second overlap region and said second distance in said second direction from said center point of said second overlap region.

16. The alignment monitor of claim 15 wherein said first length is such that when the alignment monitor is used with an image projection system the projected image of said first length is between about 4 and 12 micrometers.

17. The alignment monitor of claim 15 wherein said second length is such that when the alignment monitor is used with an image projection system the projected image of said second length is between about 12 and 20 micrometers.

18. The alignment monitor of claim 15 wherein said opaque material is chrome.

19. A method of monitoring overlay performance, comprising:

provireading a transparent mask substrate;

forming a layer of opaque material on said transparent mask substrate;

forming a first chip image having a first overlap region in said layer of opaque material, wherein said first overlap region has a center point and a first edge, forming a second chip image having a second overlap region in said layer of opaque material, wherein said second overlap region has a center point and a first edge;

forming a first square of said opaque material, wherein said first square has a center point, the length of the sides of said first square is equal to a first length, the sides of said first square are either parallel to or perpendicular to said first edge of said overlap region, and said first square is located so that said center point of said first square is a first distance in a first direction from said center point of said first overlap region and a second distance in a second direction from said center point of said first overlap region, said first direction is parallel to said first edge of said first overlap region, and said second direction is perpendicular to said first edge of said first overlap region;

forming a second square formed by removal of said opaque material, wherein said second square has a center point, the length of the sides of said second square is equal to a second length, and said sides of said second square are parallel to or perpendicular to said first edge of said second overlap region;

forming a third square of said opaque material located within said second square, wherein said third square has a center point, the length of the sides of said third square is equal to said first length, the sides of said third square are either parallel to or perpendicular to said first edge of said second overlap region, said center point of said third square has the same location as said center point of said second square, and said third square is located so that said center point of said third square is said first distance in said first direction from said center point of said second overlap region and said second distance in said second direction from said center point of said second overlap region;

providing a wafer having a layer of photoresist formed thereon;

providing an image projection system;

projecting said first chip image, said first overlap region, and said first square on said layer of photoresist using said image projection system;

projecting said second chip image, said second overlap region, said second square, and said third square on said layer of photoresist so that said second overlap region directly overlays said first overlay region using said image projection system;

developing said layer of photoresist; and monitoring the accuracy of the overlay of said first overlay region and said second overlay region by observing the developed images of said first square, said second square, and said third square in said developed photoresist.

20. The method of claim 19 wherein the image of said first length in said developed layer of photoresist is between about 4 and 12 micrometers.

21. The method of claim 19 wherein the image of said second length in said developed layer of photoresist is between about 12 and 20 micrometers.

22. The method of claim 19 wherein said opaque material is chrome.

* * * * *

UNITED STATES PATENT AND TRADEMARK OFFICE
CERTIFICATE OF CORRECTION

PATENT NO. : 6,330,355 B1  Page 1 of 1
DATED : December 11, 2001
INVENTOR(S) : Chia-Hsiang Chen, Chih-Chien Hung, Han-Ming Sheng, Hsiang-Chung Liu, Chun-Mei Lee, De-Ming Liang, Li-Kong Turn and Ming-Huei Tseng It is certified that error appears in the above-identified patent and that said Letters Patent is hereby corrected as shown below:

<u>Title page,</u>
Item [74], please delete "Ackerm" and replace with -- Ackerman -- and delete "Presco" and replace with -- Prescott --.

Signed and Sealed this

Fourth Day of June, 2002

Attest:

Attesting Officer

JAMES E. ROGAN
*Director of the United States Patent and Trademark Office*